United States Patent [19]
Schwettmann et al.
[11] 3,928,082
[45] Dec. 23, 1975

[54] SELF-ALIGNED TRANSISTOR PROCESS

[75] Inventors: Frederic Nickels Schwettmann, Richardson; John Luther Prince, III, Plano, both of Tex.

[73] Assignee: Texas Instruments Incorporated, Dallas, Tex.

[22] Filed: Dec. 28, 1973

[21] Appl. No.: 429,257

[52] U.S. Cl. .................................... 148/1.5; 357/91
[51] Int. Cl.$^2$ ........................................ H01L 21/265
[58] Field of Search ....................................... 148/1.5

[56] References Cited

UNITED STATES PATENTS

| | | | |
|---|---|---|---|
| 3,533,857 | 10/1970 | Mayer et al. | 148/1.5 |
| 3,756,861 | 9/1973 | Payne et al. | 148/1.5 |
| 3,793,088 | 2/1974 | Eckton, Jr. | 148/1.5 |

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

This invention relates to the fabrication of planar semiconductor devices and, more particularly, to the forming of such devices which have utility in very high frequency, e.g., microwave range applications. The devices fabricated according to the invention may be used in the formation of electrically isolated components in an integrated circuit and can readily be used in independent circuits or discrete devices. P+ and *n*+ regions are developed employing ion implantation techniques at low temperatures through a self-aligning, composite oxide mask.

6 Claims, 5 Drawing Figures

SELF-ALIGNED TRANSISTOR PROCESS

BACKGROUND OF THE INVENTION

In the manufacture of transistors to be utilized in high frequency applications, it is essential that the emitter and base regions be as small and as close together as possible. Prior art techniques for fabricating planar transistors for such high frequency applications, wherein conventional sequential masking/etching processes are employed have, up to the present time, been low yield processes.

In such processes, pockets, or wells of semiconducting material having the appropriate conductivity are created in a semiconductor substrate by diffusing different types of impurities into selected portions of said substrate through "windows" which have been etched out of a mask of non-conducting material formed over the surface of the substrate. Typically, a non-conducting layer of oxide is deposited or grown on the semiconductor substrate and then a layer of nitride is deposited over the oxide layer. Openings in the nitride layer (referred to as "windows") are made at predetermined locations for all regions where a dopant is eventually to be added and with designated shape and geometric configuration. At each process step, e.g., emitter, *n*+ and *p*+, the oxide in the appropriate windows in the nitride is removed. The oxide in the remaining windows prevents dopant from entering the silicon during diffusion in the open window. Introduction of the appropriate doping impurity is made through such windows by high temperature, diffusion of compounds such as phosphine ($PH_3$) and phosphorus oxychloride ($POCl_3$) for N-type doping or diborane ($B_2H_6$) and boron tribromide ($BBr_3$) for P-type doping.

The technique above described has been a low yield process for producing transistors with high frequency characteristics. In the first place, when the oxide window is opened, lateral etching of the oxide under the nitride can occur. The resulting shelf makes it very difficult to get adequate metal coverage.

More importantly, problems are often encountered in alignment of the geometry of the emitter and base regions produced by the sequential masking steps. Because the windows in the oxide layer are, at time separated by as little as two to three microns for high frequency applications, proper alignment is critical. Finally, since the emitter geometry of such transistors is of necessity quite small, contact removal of the oxide regrowth in the substrate windows is very difficult. For this reason, a process for removing the oxide by dipping the wafer in a dilute solution of hydrofluoric acid has been developed. However, even with this technique, if an optimum dip is not achieved, emitter-base shorting can result.

In the process of the present invention, the above problems are obviated. There is no requirement for a separate, nitride layer, no critical alignment problems and no contact oxide removal step.

The drawings are not necessarily to scale as dimensions of certain parts as shown therein have been modified and/or exaggerated for the purpose of clarity of illustration.

DETAILED DESCRIPTION OF THE INVENTION

Figure 1:
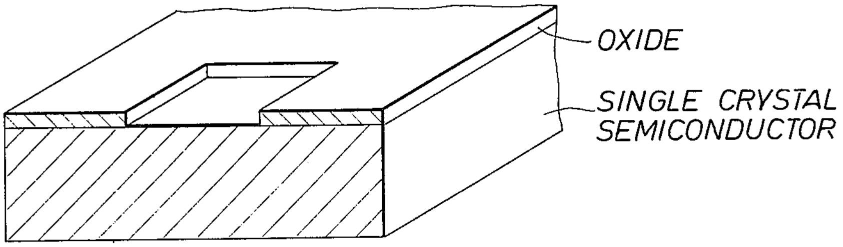
FIG. 1 is a perspective view partially in section of a semiconductor wafer having an oxide mask on the surface thereof through which has been etched the base region window according to the described process.

Referring now to FIG. 1, the method steps of the invention will be broadly described. A slice of single crystal semiconductor material, for example, a Group IVa element such as silicon or a compound such as Gallium Arsenide, is used as the starting material, which will be referred to as the substrate. This slice may be about 2 inches in diameter and about 10 mils thick. A small segment of the slice may be represented as a chip or wafer, which represents the segment occupied by one integrated circuit. Actually, the slice would contain dozens or even hundreds of the segments such as the wafer illustrated in FIG. 1.

In practice the substrate will be prepared with a selected conductivity which will be the collector region of the final transistor structure. Thus, the substrate will not be a pure crystalline structure but will rather have already been doped as a P-type or N-type semiconductor.

As a first step, an oxide layer is formed upon the upper surface of the wafer substrate, as depicted in FIG. 1. The oxide layer, which might be silicon oxide, for example, may be thermally grown by heating the entire structure to a temperature of approximately 1000°C. in the presence of oxygen. Alternatively, and particularly when the semiconductor material of the substrate is other than silicon, a vapor deposition technique may be employed.

Through the use of conventional photographic masking and etching techniques, a portion of the oxide layer is removed so as to expose a corresponding portion of the surface area of the semiconductor wafer. This removal may be accomplished by covering the oxide layer with commercially available photoresist material such as Kodak KTFR or Kodak KMER, masking, exposing selected areas to light and developing the photoresist, then etching away the unmasked areas of the oxide. By this method, an oxide mask as shown in FIG. 1 is produced directly upon the surface of the wafer and limits the area of the semiconductor substrate that is to be affected by the subsequent steps.

Figure 2:
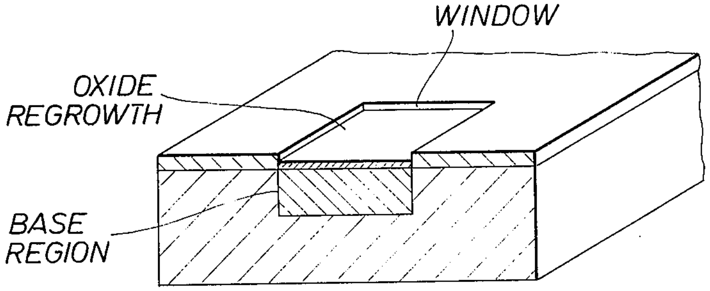
FIG. 2 is a perspective view partially in section of the wafer of FIG. 1 with the base region having been created within the wafer substrate and a thin oxide layer regenerated over the substrate surface across the base region.
Figure 3:
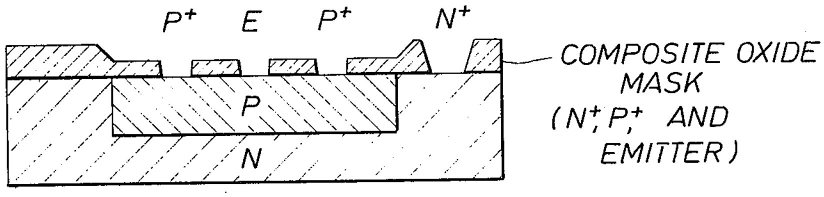
FIG. 3 is a side view in section of the wafer of FIG. 2 having the composite mask etched in the oxide layer thereof.
Figure 4:
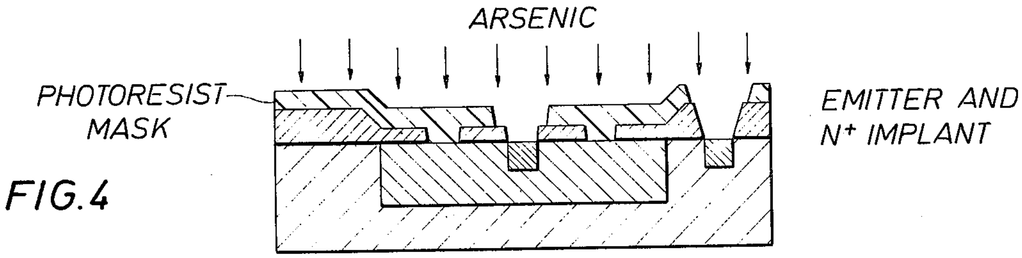
FIGS. 4 and 5 are side views illustrating the sequential process of introducing the N+ and P+ impurities through the oxide mask of FIG. 3.
Figure 5:
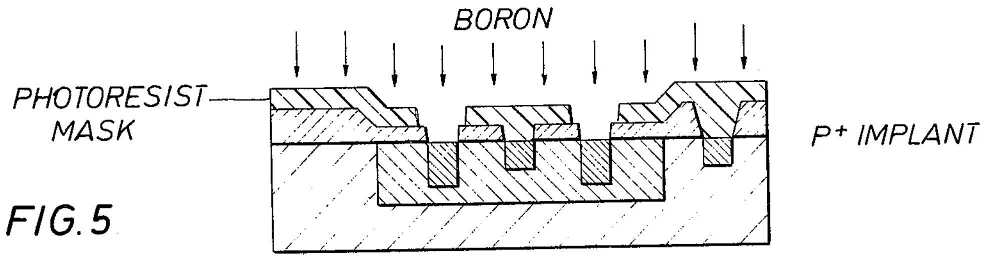

As the next step, there is introduced into the substrate by any suitable means an effective amount of the impurity necessary to create base region semiconductor characteristics. Since the oxide layer acts as a mask, such impurity will penetrate into the substrate only through the window in the mask, as has been previously described. Thus, a region which will ultimately serve as the base component of the transistor is created within a coplanar well or pocket in the substrate as shown in FIG. 2. Immediately after introduction of the base impurity, a uniformly thin layer of oxide, approximately 1000 angstroms thick, is then grown in the window over the base region. This serves to remask the substrate in preparation for subsequent processing. Alternatively, this thin base oxide may be grown initially, prior to introduction of the base impurity, and doping of the base then carried out by ion implantation through the thin oxide layer. The step height between the base and collector oxide can be minimized or substantially eliminated by photoresist masking of the base implant on a thin (about 500 to 1000 A) first oxide. The largest step would then be approximately 2000 A across the emitter-base region.

Once the base region has been created and the oxide layer regenerated, the base region should then be passivated. This can be accomplished by depositing over the region a thin phosphorus glaze using $POCl_3$ in a standard glazing furnace. A chemical vapor deposited phosphorus doped oxide may also be suitable. After passivation, the base region is covered with another layer of oxide again approximately 1000 angstroms thick, and the deposited oxide is densified by conventional methods.

Using conventional photographic masking and etching techniques, a single photoresist mask is then used to open in the oxide layer all of the windows through which the substrate will subsequently be doped. By opening the windows in a single step, geometric configuration and alignment of all the component windows and particularly with respect to the previously created base region may be determined with pinpoint accuracy. Subsequent doping operations may be carried out by a two step sequence of closing the windows through which it is not intended to introduce a particular impurity and doping through an oversized mask into the appropriate regions. Criticality of size and alignment of the photoresist masks through which doping will be carried out is no longer necessary since alignment has been predetermined by means of the oxide mask.

In the process of the present invention the emitter, P+ and N+ regions are introduced into the substrate by ion implantation techniques rather than by high temperature diffusion processes. This requirement eliminates the growth of oxide which is characteristic of furnace diffusion techniques. It also serves to provide transistor component regions of more consistent properties. Also, since photoresist is used to mask regions where dopant is not desired, diffusion processes cannot be used.

The process is applicable to the fabrication of both NPN and PNP devices, as will be well apparent to those skilled in the art. In addition, there is no criticality in the sequence of doping the emitter, isolation and collector contact regions in the fabrication of a particular device, as either the N+ or P+ impurity may be implanted first.

The novel features believed characteristic of this invention are set forth in the appended claims. The invention itself, however, as well as other objects, features, and advantages of the invention may be more fully understood through the following detailed description of an illustrative embodiment taken in conjunction with the accompanying drawings and the foregoing general description.

A crystalline N-type silicon semiconductor substrate is utilized. The surface of the substrate is covered with a protective mask of silicon oxide to a depth of from 1000 to 5000 angstroms and a window etched in said mask coextensive with the predetermined base region area. A thin layer of oxide (approximately 1000 angstroms) is then grown in the window and the base doping impurity implanted through the thin oxide layer by bombarding the masked substrate with boron ions which have been accelerated employing from 40 to 200 KEV. The base oxide is then passivated by setting the structure in a standard furnace and heating in the presence of $POCl_3$. A very thin glaze of phosphorus coats the entire surface of the oxide. The phosphorus layer is then covered with approximately 1000 angstroms of an oxide which is deposited on the surface thereof by chemical vapor deposition. After densification, all of the windows that require opening (P+, emitter, N+) are opened in the oxide layer, thus creating a single composite mask with the proper alignment and geometric configuration of the components as predetermined. A photoresist layer of Kodak KMER is then spun on and exposed to create a mask with only the emitter and N+ regions open. Since there is no alignment criticality required in this mask, the openings may be oversized, thus assuring a complete implant. The impurity used is arsenic ions which are implanted according to conventional ion implantation techniques.

After the implant is carried out the resist is removed and more resist is spun on, this time opening oversized windows in the P+ region and closing the emitter and N+ windows. The P+ is implanted by ion implantation of boron ions as was the base. The resist is then removed, the slice annealed at from 900°–1000° C. in nitrogen. Since no oxide is grown in the open windows, an additional photoresist step prior to metal deposition is not required. Instead, only a 1–2 second dip in cold dilute HF is required to remove trace amounts of "native" oxide (approximately 50A). Since the amount of oxide etched is extremely small, no problems with exposing the emitter-base junction are experienced. The electrical characteristics of the device are excellent. No base-emitter shorting is demonstrated. Using the process of the present invention, it is possible to etch windows in the oxide mask having as little as two to three microns separation. Devices are produced which operate effectively at microwave length frequencies as high as 2 gigahertz ($2 \times 10^9$ cycles/second).

What is claimed is:

1. In the process of manufacturing semiconductor transistor devices the improvement which comprises the steps of:

a. producing a uniform layer of non-conducting silicon oxide on an N-type silicon semiconductor substrate, said oxide layer having opened therein a base region window exposing a portion of said substrate surface area about 300–500 microns in diameter;

b. creating a base region by introducing into said substrate through the window in said oxide layer an effective amount of impurity necessary to create P+ conductivity semiconductor characteristics;

c. regenerating an integral coating of silicon oxide over the entire surface of said substrate by depositing approximately a 1000 A thick layer of silicon oxide across said base region, thereby closing said base region window;

d. forming a composite oxide mask by etching through to said substrate in a single step a series of openings, each approximately 1–5 microns in diameter and 2–4 microns apart, at predetermined locations with respect to said previously created base region, said openings comprising an N+ conductivity portion and a P+ conductivity portion;

e. masking a first portion of said openings and introducing into said substrate by ion implantation at temperatures below which extensive oxide growth is generated through the remaining open windows a predetermined effective amount of an impurity necessary to create N+ type conductivity regions; and thereafter f. removing the mask from said first portion of said openings and introducing through only said first portion of said windows into said substrate by ion implantation at temperatures below which extensive oxide growth is generated a predetermined effective amount of an impurity necessary to create P+ type conductivity regions.

2. The process of claim 1, wherein the semiconductor substrate is an N-type silicon material.

3. The process of claim 1, wherein the base region is created by bombarding the substrate with ions of Boron and the emitter region created by subsequent bombarding of the substrate with arsenic ions.

4. The process of claim 2, wherein the oxide mask is a silicon oxide.

5. The process of claim 1, wherein said P+ conductivity producing impurity is selected from the group consisting of aluminum and boron.

6. The process of claim 1, wherein said N+ conductivity producing impurity is selected from the group consisting of phosphorus and arsenic.

* * * * *